United States Patent [19]
Lebby et al.

[11] Patent Number: 6,084,697
[45] Date of Patent: Jul. 4, 2000

[54] INTEGRATED ELECTRO-OPTICAL PACKAGE

[75] Inventors: Michael S. Lebby, Apache Junction; Jamal Ramdani, Gilbert; Karen E. Jachimowicz, Laveen, all of Ariz.

[73] Assignee: Motorola, Inc., Schaumburg, Ill.

[21] Appl. No.: 09/118,804

[22] Filed: Jul. 20, 1998

[51] Int. Cl.[7] .............................. G02B 26/08; H01S 3/121
[52] U.S. Cl. ..................... 359/202; 359/201; 359/298; 372/14
[58] Field of Search .................................. 372/14, 24, 31, 372/32; 345/82, 83, 44, 45, 46; 359/201, 202, 197, 198, 298

[56] References Cited

U.S. PATENT DOCUMENTS

| | | | |
|---|---|---|---|
| 5,325,386 | 6/1994 | Jewell et al. | 372/50 |
| 5,525,810 | 6/1996 | Jewell et al. | 250/566 |
| 5,673,139 | 9/1997 | Johnson | 359/291 |

FOREIGN PATENT DOCUMENTS 6-283815  10/1994  Japan .

Primary Examiner—Georgia Epps
Assistant Examiner—Michael A Lucas
Attorney, Agent, or Firm—Eugene A. Parsons; William E. Koch

[57] ABSTRACT

An integrated electro-optical package including a laser diode microscanner, and an automatic focus mechanism housed within a housing. The microscanner includes a semiconductor wafer, having formed as a part thereof a cantilevered portion having mounted thereon at least one laser diode. The cantilevered portion having electrically interfaced thereto a plurality of interconnects capable of delivering varying voltages. The cantilevered portion is deflected in response to the varying voltages and therefore produces a scanning action in an "x" and/or "y" direction dependent upon the external varying voltage applied thereto and the design of the cantilevered portion. The automatic focus mechanism includes a single detector or a detector array that measures a reflected light and submits a signal to the display system optics for focus adjustment dependent upon the measurements received.

14 Claims, 3 Drawing Sheets

INTEGRATED ELECTRO-OPTICAL PACKAGE

FIELD OF THE INVENTION

The present invention pertains to the field of integrated electro-optical packages and more specifically to integrated electro-optical packages incorporating laser scanning devices to generate a fully integrated image within an observer's field of view.

BACKGROUND OF THE INVENTION

The human visual system is a complex system with a great ability to absorb vast amounts of information originating in many varying formats, including visual displays. Visual displays are found in varying sizes and forms in today's world, displaying many types of information, from large visual display screens announcing scheduling information found in airports, to small visual displays, such as those incorporated into pocket calculators. Included within these visual displays are direct view displays, including projection displays, and virtual image displays. Of concern in the reduction in the size of visual displays, specifically those utilized in portable electronic devices, such as portable communications equipment, smart-card reader devices, or the like, is the display resolution quality and the maintenance of minimal power requirements and low manufacturing costs.

Of relevance in the reduction in size of visual displays, and the maintenance of resolution quality, is the human visual system's ability to process and integrate information, and the speed at which the visual system is able to do so. Accordingly, scanning techniques have become of great importance in the field of visual displays. In theory, the human visual system can process and interpret information no faster than approximately 60 Hz. Therefore, an image that is projected and scanned within $\frac{1}{60}$th of a second to varying positions within a visual display is seen by the eyes of the viewer as one enlarged integrated image.

As an example, by moving an image of an "A" to six different locations within a visual display, at a speed of 60 Hz, the viewer will see one integrated image composed of six "A"s.

If the image is simultaneously content modulated, for example, the images are of six letters "A", "B", "C", "D", "E" and "F" that are individually and sequentially moved to six varying positions at a speed of 60 Hz., the viewer will see one integrated image composed of the six letters. This process, more commonly known as time-multiplexed imagery, can be utilized in the field of display technology through the use of scanners, and more specifically in the development of enhanced resolution miniature visual displays, including projection displays.

Scanning devices utilized today aid in increasing the resolution of visual displays and decreasing power requirements through the utilization of fewer light sources. These scanning devices can be found in many forms, most commonly electro-mechanical scanners incorporating mirrors, such as galvanometric scanners and polygonal scanners. Of particular interest, are virtual displays and projection displays and the use of mirrors to achieve scanning and thus generation of a displayed image. These types of electro-mechanical scanners are commonly quite large in size, therefore not amenable to the incorporation into a display device that is small, lightweight, operates with low power consumption and is meant to be portable in nature. In addition, mechanical scanners, are complex, require separate light sources and thus expensive to manufacture and in many instances utilize great amounts of power during operation.

Thus, there is a need for an electro-optical package for use in a miniature visual display that includes a small scanning device that allows for the generation of a high resolution miniature visual display, in particular either a virtual image display or a projection display. The package operates by employing a microscanner that utilizes "x" and "y" scanning techniques. In particular the microscanner operates by scanning individual lasers or laser arrays, to create a complete scanned image.

Accordingly, it is highly desirable to provide for an electro-optical package including a scanning device, that utilizes a silicon wafer having positioned on a cantilevered portion thereof, a single laser device or a plurality of laser devices, thereby providing for the scanning of an individual pixel, and/or pixels, and thus generating a low-powered virtual image display or a projection display for use with portable electronic equipment and an automatic focus mechanism for determination of focus distance from the laser diode light source.

It is a purpose of the present invention to provide a new and improved integrated electro-optical package including a laser diode microscanner and an automatic focus mechanism, including a photodetector, for use in virtual image display systems and projection display systems.

It is a further purpose of the present invention to provide a new and improved integrated electro-optical package including a laser diode microscanner which utilizes varying electrostatic charges to achieve "x" and/or "y" scanning, thereby allowing for the incorporation of the electro-optical package into miniature virtual image displays and projection displays.

It is a still further purpose of the present invention to provide for a new and improved integrated electro-optical package including a laser diode microscanner and an automatic focus mechanism, such as a detector, thus allowing for proper focusing of the image source relative to the display screen, etc.

SUMMARY OF THE INVENTION

The above problems and others are substantially solved and the above purposes and others are realized in an integrated electro-optical package including a laser diode microscanner, and an automatic focus mechanism. The microscanner includes a semiconductor wafer, such as a silicon wafer, having formed as a part thereof a cantilevered portion having mounted thereon at least one laser diode. The at least one laser diode having electrically interfaced thereto a plurality of interconnects capable of delivering operational voltages. The cantilevered portion having electrically interfaced thereto a plurality of interconnects capable of delivering varying voltages. The cantilevered portion is deflected in response to the varying voltages and therefore produces a scanning action in an "x" and/or "y" direction dependent upon the external varying voltage applied thereto and the design of the cantilevered portion. The automatic focus mechanism includes a single detector or a detector array that measures a reflected light and submits a signal to the display system optics for focus adjustment dependent upon the measurements received.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

During the course of this description, like numbers are used to identify like elements according to the different figures that illustrate the invention. The integrated electro-optical package of the present invention includes a microscanner, and an automatic focus mechanism and is intended for use in visual display systems, including miniature virtual image displays and projection displays. The microscanner of the present electro-optical package is based on utilizing individually addressable visible light emitting devices, more particularly laser diodes, including edge emitting laser and vertical cavity surface emitting lasers (VCSELs), that in combination with driver/control circuitry compose the microscanner of the electro-optical package of the present invention. The electro-optical package, with its integrated scanning capabilities is employed to create a high resolution image from a small number of light sources. This scanning action forms what appears to the observer to be a high resolution integrated image. Those skilled in the art will appreciate that scanning allows a full page display to be created from a small number of light sources. The resultant integrated image is viewable as either a virtual image or a projected image.

The scanning process utilized in the present invention is based on the principle of "x" and "y" scanning, thereby altering the path of light emitted by portions or elements of the array. More particularly, in the preferred embodiment an electro-optical package having housed therein a microscanner and having mounted thereto a cantilevered portion at least one light emitting device, is utilized to which an external stimulus is applied, thereby providing for "x" and/or "y" scanning dependent upon the electrostatic charge applied thereto and the cantilever design. This resulting scanning of the light allows for the image source, having minimal light sources (laser diodes), to generate an integrated image that appears to be composed of a high number of pixels. The electro-optical package of the present invention is intended for integration into a visual display system in which scanning techniques are sought to be utilized to minimize the need for great numbers of light emitting devices.

In the preferred embodiment, the use of a microscanner to bring about the scanning of the light emitted by the laser diodes, allows for a display system into which the electro-optical package is included to remain small in size and permits it to be incorporated into miniature visual displays such as those found in portable electronics equipment, or the like. During operation the "x" and "y" scanned signals are synchronized to allow for a full "x" and "y" scan to take place.

Figure 1:
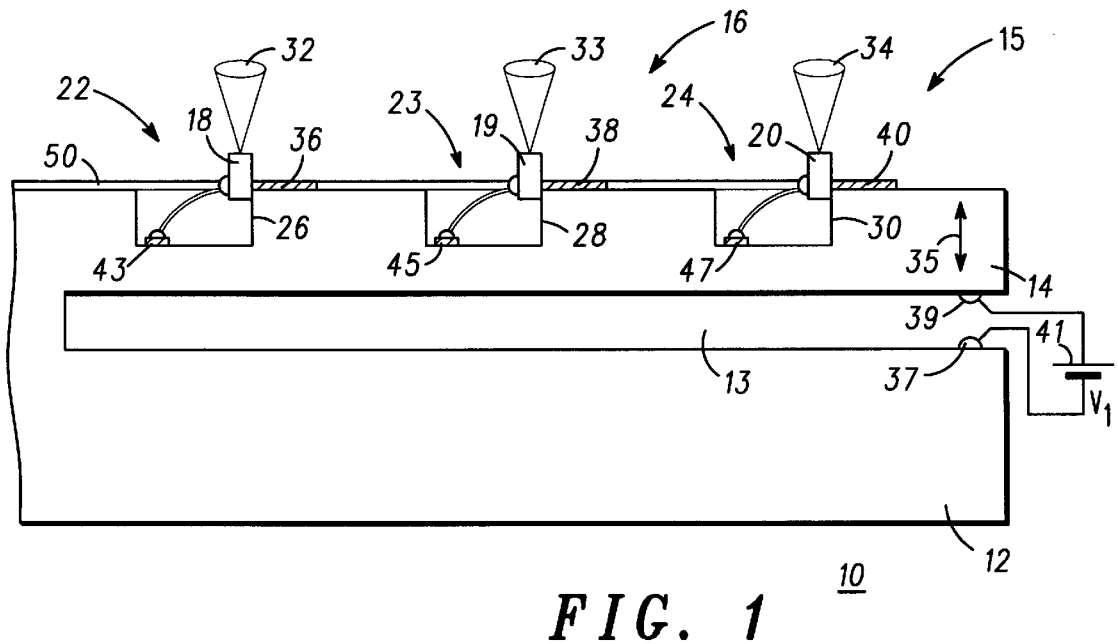
FIG. 1 is a simplified sectional view taken through line 1—1 of FIG. 2, illustrating a portion of a microscanner including a plurality of spaced laser diodes according to the present invention.
Figure 2:
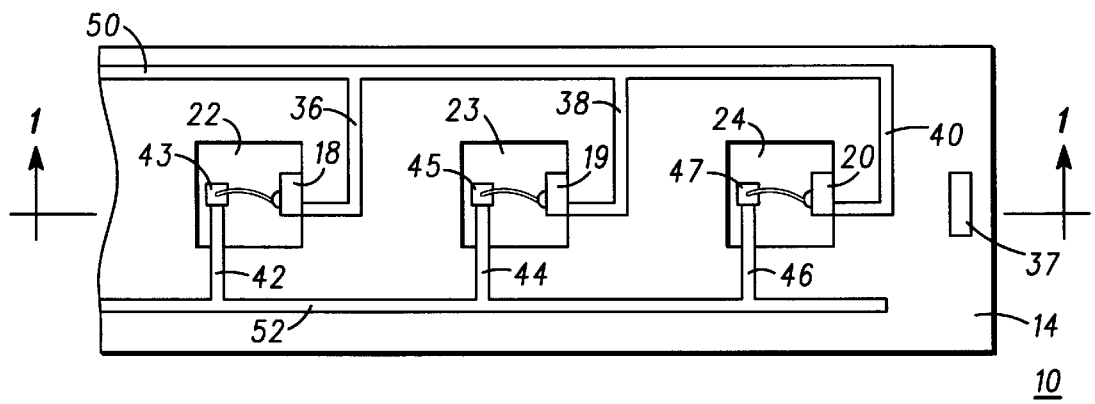
FIG. 2 is a simplified top view of the microscanner of FIG. 1, illustrating the electrical interface of each laser diode according to the present invention.

Referring now to the accompanying illustrations, and more specifically to FIGS. 1 and 2, illustrated is a first embodiment of a portion of a microscanner 10 intended for housing within the electro-optical package (discussed presently) of the present invention. Microscanner 10 includes a silicon wafer 12 having formed as a part thereof a cantilevered portion 14 using standard cantilever fabrication approaches. A plurality of laser diodes 16 are positioned in a central aspect 15 of cantilevered portion 14 which is characterized as undergoing deflection in response to an electrostatic charge applied thereto. In this embodiment, plurality of laser diodes 16 includes a red laser diode 18 emitting light in a range of 635–680 nm, a green laser diode 19 emitting light in a range of 540–560nm, and a blue laser diode 20 emitting light in a range of 410–460 nm, thereby capable of generating a full color image. It should be understood that the placement of laser diodes 18, 19 and 20 is exemplary and other layouts are anticipated by this disclosure and are design specific dependent upon scanning techniques utilized and desired image outcome. A plurality of cavities 22, 23 and 24 are fabricated into cantilevered portion 14 and defined by a plurality of sidewalls. Laser diodes 16 are mounted on a side walls 26, 28 and 30 of cavities 22, 23, and 24, respectively. As illustrated, laser diodes 18, 19 and 20 emit light, as illustrated and referenced 32, 33, and 34. In this particular embodiment, laser diodes 18, 19, and 20 are disclosed as being edge emitting lasers, but it should be understood that vertical cavity surface emitting lasers, fabricated on a substrate (not shown) as is generally well known in the art, can be utilized, including ridge VCSELs, planar VCSELs, or oxide based VCSELs. Further information on the fabrication of VCSELs can be found in U.S. Pat. No. 5,258,316, entitled, "PATTERNED MIRROR VERTICAL CAVITY SURFACE EMITTING LASER", issued Nov. 2, 1993, and U.S. Pat. No. 5,293,392, entitled "TOP EMITTING VCSEL WITH ETCH STOP LAYER", issued Mar. 8, 1994, both assigned to the same assignee and incorporated herein by this reference.

During operation an external electrical stimulus supplies varying electrostatic charges to scanner 10, thereby causing cantilevered portion 14 to deflect along an "x" axis, as illustrated by directional arrow 35, relative to a lower portion of silicon wafer 12. This deflection of cantilevered portion 14 allows for scanning in an "x" direction of light emitted by laser diodes 18, 19 and 20. It should be understood that the scanning direction is cantilever design specific and that cantilevered portion 14 can be designed to allow for "x" scanning, "y" scanning, or "x" and "y" scanning (discussed presently).

Referring now to FIG. 2, plurality of electrical interconnects 36, 38 and 40 are illustrated for electrical interface of a positive terminal or contact of laser diodes 18, 19 and 20 to an external power source (not shown). In this particular embodiment, electrical interconnects 36, 38 and 40 provide for the positive interface and a plurality of interconnects 42, 44, and 46 provide for the negative interface with negative terminals, or contacts, 43, 45, and 47 and the external power source (not shown). A plurality of electrical interconnects, or traces, 50 and 52, electrically interface the positive and negative interconnects of diodes 18, 19 and 20 to the external power source (not shown). In addition, there is provided on cantilevered portion 14 a plurality of electrical contacts 37 and 39, electrically interfaced with a voltage source 41, so as to create a deflection of cantilevered portion 14 in response to the varying voltages applied by voltage source 41. This deflection of cantilevered portion 14 provides for the scanning action of laser diodes 18, 19 and 20.

These contacts to the laser diodes 18, 19 and 20 and contacts 37 and 39 are formed by conventional deposition and/or etching techniques wherein, for example, common row and column bus contacts 36, 38, 40, 42 and 44 are formed to individually address each laser diode 18, 19, and 20, as is generally known in the art. There is provided a plurality of driver/control circuits (not shown) having data input terminals and further having control signal output terminals connected to the laser diodes 18, 19 and 20 through a plurality of connection pads (not shown), for activating and controlling each of the laser diodes 18, 19 and 20 and a plurality of driver/control circuits (not shown) having input terminals and further having output terminals connected to contacts 37 and 39, in combination characterized as generating an image utilizing scanning techniques in accordance with signals applied to the input terminals.

In the present invention, a small number of interconnects are needed in that there are a small number of light emitting devices, or laser diodes, required to be defined because of the utilization of scanning techniques. Because of this small number of interconnects, the manufacturing yield of microscanner 10 is high, thereby resulting in low manufacturing costs. In addition to serving as a means for the placement of electrical interconnects, silicon wafer 12 additionally serves as a protective element for diodes 18, 19 and 20, more particularly for thermal heat-sinking.

During the scanning process, varying external voltages are applied to microscanner 10, more particularly to cantilevered portion 14. The light emitted by diodes 18, 19 and 20 is scanned relative to the degree of deflection of cantilevered portion 14 in response to the varying voltages applied, resulting in a scanning action of the light emitted therefrom. Generally speaking, the resultant light emitted, having undergone a change in an "x" direction, changes direction of travel to fill an area of a display with a specific portion of the image. The scanning action works by scanning image data information.

Figure 3:
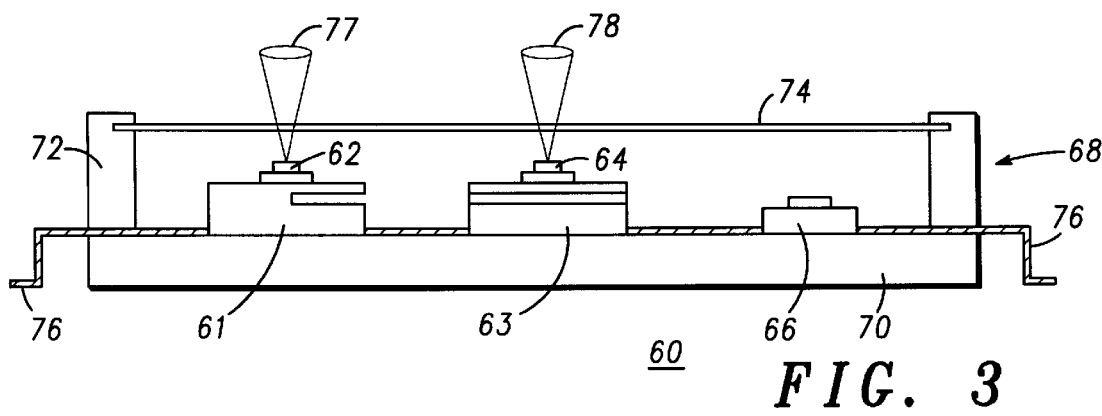
FIG. 3 is a simplified sectional view of an electro-optical package according to the present invention.

Referring now to FIG. 3, illustrated in simplified sectional view is a preferred embodiment of the electro-optical package according to the present invention. Illustrated is electro-optical package 60 having housed therein a microscanner 62 for scanning in the "x" direction, a microscanner 64 for scanning in the "y" direction, and a detector 66 for automatic focus control of the image generated by electro-optical package 60.

Detector 66 is disclosed in the preferred embodiment as including any suitable photodetector well known in the art, such as a p-i-n photodetector, m-s-m photodetector, or the like. Photodetector 66 generally includes a plurality of material layers and a conductive layer fabricated directly on a substrate element. In a projection display system, by capturing some of the light with photodetectors, the distance from source to screen can be determined by measuring the relative performance time for light to exit the light source, reach a display screen, reflect off the display screen and bounce back to the detector. The relative performance time will be measured and converted to an electrical signal which will be fed to the optics included within the display system in which the electro-optic package is utilized. In an alternative embodiment in which the integrated electro-optic package is utilized in a virtual image display system, the detector will measure light that is reflected off of the retina of the user and returned to the detector. The detector electronics will use the size and shape of the return reflection to determine the accommodation position, or focus position, of the eye. The system will then focus the optics to place the virtual image at the accommodation distance of the eye, and the virtual image will be viewed as in focus. The system will be active, so that as the eye changes focus, the virtual image will be moved accordingly to keep the image in focus.

Electro-optical package 60 includes a housing 68 including a base portion 70 and a plurality of sidewalls 72. Housing 68 is generally formed of a plastic material, utilizing transfer injection technology, onto which microscanners 61 and 63, including laser diodes 62 and 64, and detector 66 are mounted. Housing 68 has provided as an uppermost element, a transparent top portion 74, thereby enclosing laser diodes 62 and 64 and detector 66. Top portion 74 is transparent thereby allowing for the light emitted by laser diodes 62 and 64 to pass therethrough and allowing for a reflected light to bounce back and be detected by detector 66.

There is provided a plurality of electrical interconnects positioned on lower portion 70 of housing 68, in electrical interface with laser diodes 62, and 64, more particularly microscanners 61 and 63, and photodetector 66. Electro-optical package 60 is interfaced with a display system (not shown) through a plurality of copper leads 76.

During operation, microscanner 61 and 63 under the influence of a varying voltage, undergo a deflection of their respective cantilevered portions, thereby providing for a scanning of light 77 and 78 emitted by laser diodes 62 and 64. This movement of the respective cantilevered portions, allows for scanning in an "x" direction for laser diode 62 and a "y" direction for laser diode 64, or vice versa, dependent upon design and orientation. By using this scanning technique, an integrated image is formed having higher resolution. It should be understood that single laser diode microscanners, generally for use in the generation of a monochrome image and multi-laser diode microscanners, such as that illustrated in FIG. 1, are anticipated by this disclosure. In particular, multi-laser diode microscanners that include a red, a green and a blue laser diode so as to generate a full color image are disclosed herein.

Figure 4:
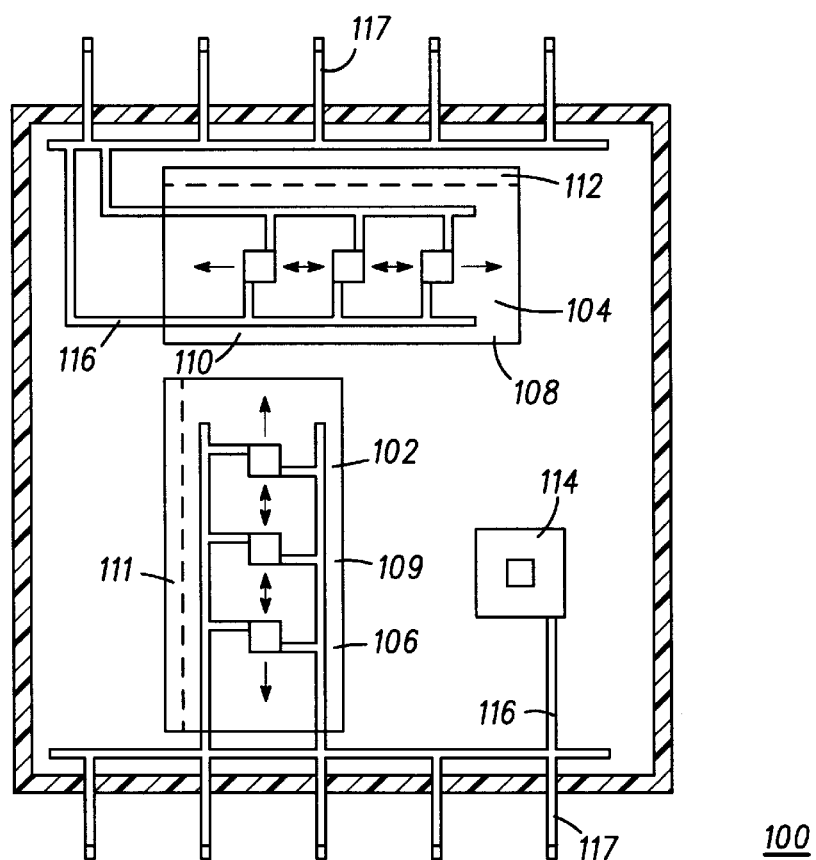
FIGS. 4 and 5 are simplified top views of a plurality of specific electro-optical packaging embodiments for "x" and "y" scanning according to the present invention.
Figure 5:
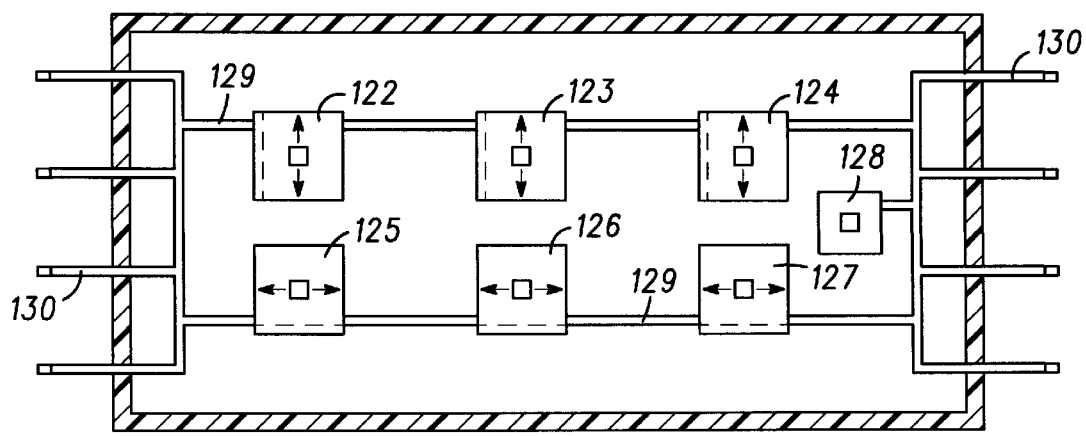

Referring now to FIGS. 4 and 5, illustrated are a variety of electro-optical package designs of the present invention, more particularly illustrating a plurality of laser diode and photodetector layouts dependent upon the type of scanning sought to be achieved. As illustrated, synchronized "x" and "y" scanning are anticipated.

Referring more specifically to FIG. 5, illustrated in simplified top view is an electro-optical package 100 including microscanners 102 illustrating a laser diode layout for "x" scanning and microscanner 104 illustrating a laser diode layout for "y" scanning. Each microscanner 102 and 104 includes a plurality of laser diodes, generally including a red laser diode emitting light in a range of 635–680 nm, a green laser diode emitting light in a range of 540–560 nm, and a blue laser diode emitting light in a range of 410–460 nm. This particular embodiment of electro-optical package 100 includes two microscanners so as to provide for both "x" and "y" scanning. Each microscanner 102 and 104 includes a silicon wafer 106 and 108, respectively, of which included is a cantilevered portion 109 and 110, respectively, having support noted by a portion 111 and 112. This type of cantilevered arrangement allows movement of cantilevered portion 109 of microscanner 102 about an "x" axis, thus achieving scanning in an "x" direction as noted by the illustrative directional arrows and movement of cantilevered portion 110 of microscanner 104 about an "y" axis, thus achieving scanning in a "y" direction as noted by the illustrative directional arrows. Thus by synchronizing the resultant signals, two-dimensional scanning can be achieved. A photodetector 114 is provided to receive a reflected portion of the emitted light, thereby submitting a signal to optics positioned within the display system (not shown) and thus achieving automatic focus adjustment as previously detailed.

A plurality of electrical traces 116 are provided to electrically interface microscanners 102, 104 and photodetector 114 and thus allow for a "plug-in" interface with a display system. To this end, a plurality of copper leads 117 are provided.

Figure 6:
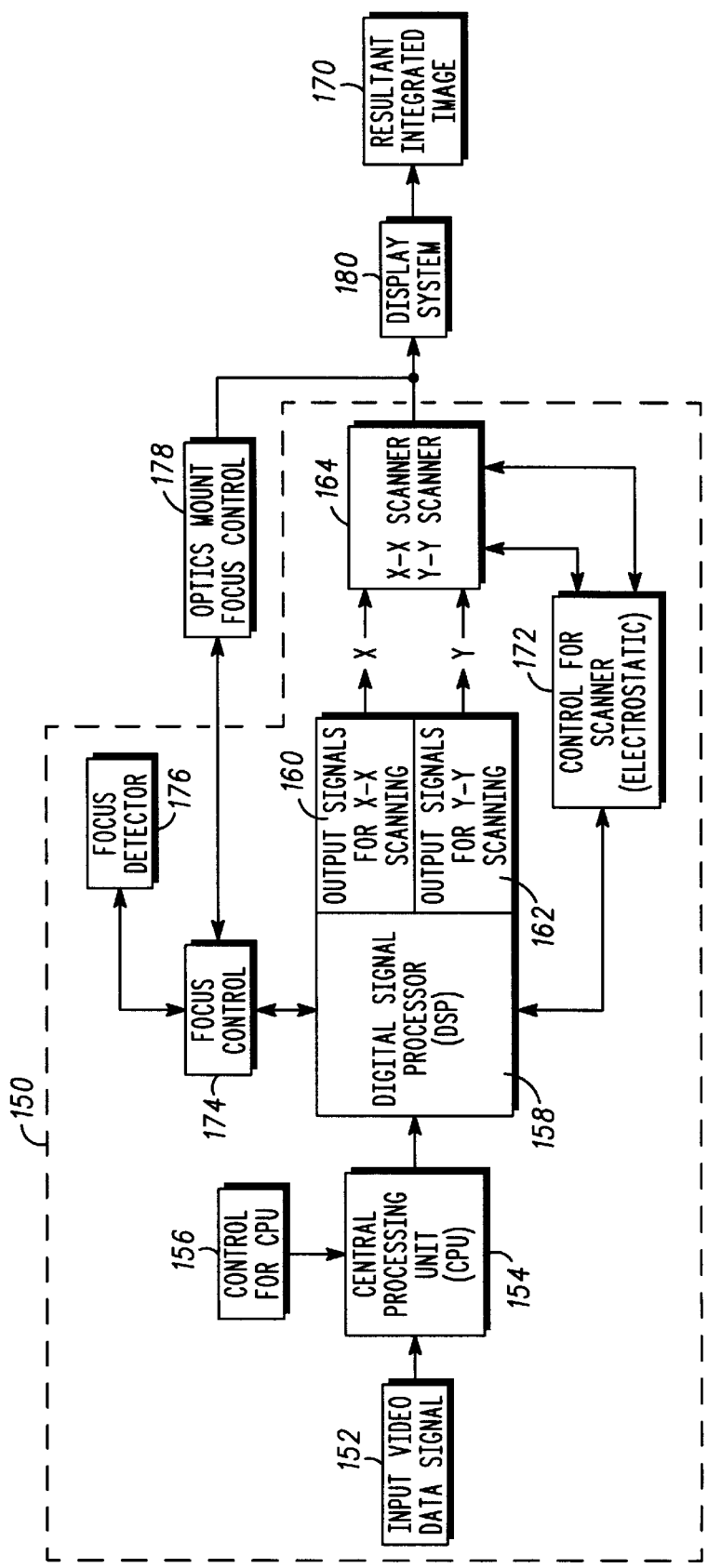
FIG. 6 is a schematic electrical block diagram of the integrated electro-optical package of the present invention.

Referring to FIG. 6, similar to the electro-optical package 100 of FIG. 5, illustrated is an electro-optical package 120 including a plurality of individually fabricated microscanners 122, 123, 124, 125, 126, and 127 each having mounted thereon a laser diode so as to generate a resultant full color image. In addition, included is a photodetector 128 for automatic focus adjustment. Microscanners 122, 123 and 124 are fabricated to scan about an "x" axis, thus achieving scanning in an "x" direction as noted by the illustrative arrows. Microscanners 125, 126 and 127 are fabricated to scan about a "y" axis, thus achieving scanning in a "y" direction as noted by the illustrative arrows.

As illustrated, microscanners 122, 123, 124, 125, 126 and 127 are fabricated utilizing individual silicon wafers. In an alternative embodiment, and as illustrated in FIG. 4, multiple laser diodes are fabricated on a single silicon wafer. In each instance, in that a red, a green and a blue laser diode are utilized, a resultant full color image is generated by synchronizing the generated "x" and "y" signals.

A plurality of electrical traces 129 are provided to electrically interface microscanners 122, 123, 124, 125, 126 and 127 and photodetector 128 and thus allow for a "plug-in" interface with a printed circuit board (PCB), etc. To this end, a plurality of copper leads 130 are provided.

Referring now to FIG. 6, illustrated in simplified block diagram are the electronics of the electro-optical package of the present invention. Electro-optical package 150 includes an input for video data input signal 152 for the input of communicative information to electro-optical package 150. A central processing unit (CPU) 154 is provided including a control 156. A digital signal processor (DSP) 158 includes a processor for processing of the input signals into output signals for x—x scanning 160 and output signals for y—y scanning 162. Output signals 160 and 162 are received by a scanner 164 capable of achieving x—x and y—y scanning to generate a resultant high resolution image 170. Scanner 164 is controlled by controller 172. A focus control mechanism 174 includes a focus detector 176 and optics 178. During operation focus detector 176 monitors a reflection of light generated by the light emitting devices and a focus signal is submitted by the focus controller 174 to optics 178 located external to electro-optical package 150. This focus adjustment aids in the focus of resultant integrated image 170 generated by electro-optical package 150 and a display system 180.

Thus, a new and improved electro-optical package including microscanning device which is intended for incorporation into a portable electronic device for the generation of a miniature virtual image display or a projection display is disclosed which is relatively easy and inexpensive to manufacture. The microscanner includes various optical components while conveniently integrating electrical connections to the components and providing external connections thereto. In addition, provided is a photodetector for automatic focus adjustment of the resultant integrated image. By using laser diodes for the light source, which are scanned to generate the resultant integrated image, characterized by high resolution, the size of the electro-optical package is reduced and the electrical power required is also minimized.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. An electro-optical package comprising: a housing:
   a first microscanner positioned within the housing, the first microscanner including a semiconductor wafer having integrally formed therein a cantilevered portion characterized as vertically deflecting about an "x" axis normal to a lower portion of the semiconductor wafer, the first microscanner including and at least one laser diode mounted to a surface of the cantilevered portion of the semiconductor wafer;
   at least one additional microscanner including a semiconductor wafer having integrally formed therein a cantilevered portion characterized as vertically deflecting about a "y" axis normal to a lower portion of the semiconductor wafer, the at least one additional microscanner including at least one laser diode mounted to a surface of the cantilevered portion of the semiconductor wafer;
   a photodetector positioned within the housing; and
   a plurality of electrical interconnects electrically interfacing the first microscanner, the at least one additional microscanner, and the photodetector.

2. An electro-optical package as claimed in claim 1 wherein the housing includes a transparent top portion, a plurality of sidewalls, and a lower portion having mounted thereto the first microscanner, the at least one additional microscanner and the photodetector.

3. An electro-optical package as claimed in claim 2 wherein the first microscanner and the at least one additional microscanner further each include at least one driver/control circuit connected to the at least one laser diode for delivering a voltage in response to data input and a driver/control circuit connected to the semiconductor wafer for delivering a plurality of varying voltages to the semiconductor wafer, thereby deflecting the cantilevered portion in response thereto and generating a resultant integrated image viewable by an observer.

4. An electro-optical package as claimed in claim 3 wherein the at least one microscanner includes a read laser diode, a green laser diode, and a blue laser diode for generating a full color resultant integrated image.

5. An electro-optical package comprising:
   a housing, including a lower portion, a plurality of sidewalls and a transparent top portion;
   a first microscanner and at least one additional microscanner, the first microscanner and the at least one additional microscanner each including a semiconductor wafer having integrally formed therein a cantilevered portion characterized as vertically deflecting normal to a lower portion, at least one laser diode, mounted to a surface of the cantilevered portion of the semiconductor wafer and positioned within the housing for receiving video data input signals;

a photodetector positioned within the housing;

electronics for electrically interfacing the first microscanner and the at least one additional microscanner and the photodetector; and a plurality of copper leads extending from the electronics for electrically interfacing the electro-optical package with an optical display system.

6. An electro-optical package as claimed in claim 5 wherein the at least one laser diode includes a red laser diode, a green laser diode and a blue laser diode, thereby generating a resultant full color integrated image viewable by an observer.

7. An electro-optical package as claimed in claim 5 wherein the first microscanner and the at least one additional microscanner each further include at least one driver/control circuit connected to the at least one laser diode for delivering a voltage in response to data input and a driver/control circuit connected to the semiconductor wafer for delivering a plurality of varying voltages to the semiconductor wafer, thereby deflecting the cantilevered portion in response thereto and generating a resultant integrated image viewable by an observer.

8. An electro-optical package as claimed in claim 5 wherein the housing is formed of a plastic material utilizing transfer injection technology.

9. An electro-optical package comprising:

a housing, including a lower portion, a plurality of sidewalls and an upper transparent portion;

a first microscanner and at least one additional microscanner positioned within the housing for receiving video data input signals, the first microscanner and the at least one additional microscanner each including a semiconductor wafer having integrally formed therein a cantilevered portion characterized as vertically deflecting normal to a lower portion and including a plurality of laser diodes emitting light, mounted to a surface of the cantilevered portion of the semiconductor wafer, for generating a full color integrated image;

a p-i-n photodetector, positioned within the housing to receive a reflected portion of light emitted by the plurality of laser diodes;

electronics for electrically interfacing the first microscanner and the at least one additional microscanner and the photodetector; and a plurality of copper leads extending from the electronics for electrically interfacing the electro-optical package with an optical display system.

10. An electro-optical package as claimed in claim 9 wherein the plurality of laser diodes include a red laser diode emitting light in a range of 635–680 nm, a green laser diode emitting light in a range of 540–560 nm, and a blue laser diode emitting light in a range of 410–460 nm.

11. An electro-optical package as claimed in claim 9 wherein the electronics include a central processing unit for receiving video data signals and a digital signal processor for processing the received signals into output signals for scanning.

12. An electro-optical package as claimed in claim 9 further including a focus controller for receiving and processing signals from the photodetector.

13. An electro-optical package as claimed in claim 9 wherein the full color integrated image is viewed as a projection image.

14. An electro-optical package as claimed in claim 9 wherein the full color integrated image is viewed as a virtual image.

* * * * *